(12) United States Patent
Huang et al.

(10) Patent No.: US 8,304,270 B2
(45) Date of Patent: Nov. 6, 2012

(54) SUSPENDING LIQUID OR SOLUTION FOR ORGANIC OPTOELECTRONIC DEVICE, MAKING METHOD THEREOF, AND APPLICATIONS

(75) Inventors: Jing-Shun Huang, Taipei (TW); Ching-Fuh Lin, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/482,866

(22) Filed: May 29, 2012

(65) Prior Publication Data

US 2012/0235139 A1    Sep. 20, 2012

Related U.S. Application Data

(62) Division of application No. 12/574,697, filed on Oct. 6, 2009.

(30) Foreign Application Priority Data

Aug. 26, 2009    (TW) .............................. 98128628 A

(51) Int. Cl.
*H01L 21/00*    (2006.01)

(52) U.S. Cl. ............... 438/47; 438/46; 438/85; 438/99; 438/E29.068

(58) Field of Classification Search .................. 438/46, 438/85, 99, 107
See application file for complete search history.

(56) References Cited

U.S. PATENT DOCUMENTS

| | | | |
|---|---|---|---|
| 7,211,463 B2 | 5/2007 | Hu et al. | |
| 7,884,044 B2 * | 2/2011 | DiFranco et al. | ............. 502/101 |
| 2008/0075857 A1 | 3/2008 | Chen et al. | |
| 2009/0045738 A1 | 2/2009 | Tsutsui et al. | |

* cited by examiner

*Primary Examiner* — Dung A. Le
(74) *Attorney, Agent, or Firm* — Stout, Uxa, Buyan & Mullins, LLP

(57) ABSTRACT

A suspension or solution for an organic optoelectronic device is disclosed. The composition of the suspension or solution includes at least one kind of micro/nano transition metal oxide and a solvent. The composition of the suspension or solution can selectively include at least one kind of transition metal oxide ions or a precursor of transition metal oxide. Moreover, the method of making and applications of the suspension or solution are also disclosed.

9 Claims, 7 Drawing Sheets

SUSPENDING LIQUID OR SOLUTION FOR ORGANIC OPTOELECTRONIC DEVICE, MAKING METHOD THEREOF, AND APPLICATIONS

CROSS-REFERENCE TO RELATED APPLICATIONS

This application is a divisional of U.S. application Ser. No. 12/574,697, filed on Oct. 6, 2009, which claims priority from Taiwan Patent Application No. 098128628, filed on Aug. 26, 2009, the entire contents of both which are incorporated herein by reference.

BACKGROUND OF THE INVENTION

1. Field of the Invention

The present invention generally relates to a suspension or solution, having transition metal oxide, and more particularly to a suspension, or solution, having transition metal oxide for an organic optoelectronic device, methods of making same, and applications thereof.

2. Description of Related Art

Organic optoelectronic devices, such as organic solar cells (OSC), organic light, emitting diodes (OLED), organic light, sensors, and so on, have many advantages. For example, the organic optoelectronic devices can be light-weight, thin, large-area, flexible, and low-cost devices.

In order to increase the power conversion efficiency of the organic optoelectronic device, a buffer layer can be disposed between an organic layer and electrode of the device. For example, a thin layer composed of calcium or lithium fluoride can be disposed between the aluminum electrode and the organic layer. A buffer layer including poly(3,4-ethylenedioxythiophene), or PEDOT, can be disposed between the transparent electrode and the organic layer so as to increase the power conversion efficiency.

However, the aluminum of such an electrode, the calcium, or the lithium, fluoride can be easily oxidized in the presence of air, which may cause an increased resistance of the device. Moreover, due to PEDOT being corrosive, the transparent electrode can be easily damaged by the presence of PEDOT.

In order to address the problems described above, efforts have been made to replace the aluminum electrode with a high work-function metal to be used as a cathode, and with transition metal oxides, such as vanadium oxide or tungsten oxide, being formed between the cathode and the organic layer for transporting or injecting holes effectively so as to increase the power conversion efficiency. Moreover, another transition metal oxide, zinc oxide, which is not corrosive, can be formed between the transparent electrode (anode) and the organic layer. The zinc oxide can be used as an electron transporting or electron injecting layer in place of PEDOT.

The transition metal oxide layers described above are usually formed using a vacuum evaporation process. The cost of making such layers, however, is high, and it is difficult to produce a large-area device. Some transition metal oxide layers can be formed by the sol-gel method. While it is possible to produce a large-area device using the sol-gel method, the sol-gel method includes a high temperature annealing treatment. Consequently, the processing temperature is usually higher than the glass transition temperature (Tg) of the organic material, which may result in damage to the organic layer.

SUMMARY OF THE INVENTION

It is an object of the present invention to provide a suspension or solution having transition metal oxide for an organic optoelectronic device. The method of making the suspension is simple, and performance of the organic optoelectronic device can be dramatically increased.

It is another object of the present invention to provide a cost-effective organic optoelectronic device. There is no need to use the expensive vacuum evaporation process for forming the transition metal oxide layer of the organic optoelectronic device. Thus, the cost of making the suspension is decreased.

It is another object of the present invention to provide a higher yield of damage-free organic optoelectronic devices. There is no need to use the high-temperature annealing treatment for forming the transition metal oxide layer of the organic optoelectronic device. Thus, the risk of damaging the organic layer is avoided.

In order to achieve the above objects, the present invention provides a suspension or solution having transition metal oxide for organic optoelectronic devices. The suspension or solution includes at least one kind of micro/nano transition metal oxide, a solvent, and optionally at least one kind of transition metal oxide ion or a precursor of transition, metal oxide.

In order to achieve the above objects, the present invention provides a method of making a suspension or solution having transition metal oxide for an organic optoelectronic device. The method includes providing at least one kind, of micro/nano transition metal oxide, providing a solvent, and performing a mixing process to disperse the micro/nano transition metal oxide uniformly and optionally to dissolve part of the micro/nano transition metal oxide within the solvent.

In order to achieve the above objects, the present invention provides an organic optoelectronic device with a transition metal oxide. The organic optoelectronic device includes a first electrode, a second electrode, an organic layer, and a transition metal oxide layer. The organic layer is disposed between the first electrode and the second electrode. The transition metal oxide layer contacts the organic layer. The transition metal oxide layer is composed of a plurality of stacked micro/nano transition metal oxide structures. The transition metal oxide layer is formed by a suspension coating method or a solution coating method. The transition metal oxide layer is un-annealed.

In order to achieve the above objects, the present invention provides a method of making an organic optoelectronic device with transition metal oxide structures. The method includes providing a substrate and a solution or suspension having a plurality of micro/nano transition metal oxide structures, and performing a coating process for coating the solution or suspension on the surface of the substrate. When the solvent of the solution or suspension, is removed, the micro/nano transition metal oxide structures are stacked for forming a transition metal oxide layer on the substrate. The transition metal oxide layer is un-annealed.

Compared to conventional procedures, the cost of making the provided organic optoelectronic device is dramatically decreased. There is no need to use the expensive vacuum evaporation process for forming the transition metal oxide layer of the organic optoelectronic device. Additionally, there is no need to use the annealing treatment for forming the transition metal oxide layer of the organic optoelectronic device. Thus, the risk of high-temperature annealing treatment that may damage the organic layer is prevented. Moreover, the current-voltage characteristics and the stability of the device can be improved by the transition metal oxide layer of the present invention.

DETAILED DESCRIPTION OF THE INVENTION

A detailed description of the present invention will now be provided in the context of the following embodiments, which are not intended to limit the scope of the present invention and which can be adapted for other applications. While the drawings are illustrated in detail, it is to be appreciated that the quantity of components may be greater or less than that disclosed, except for instances expressly restricting the amount of the components.

Figure 1A:
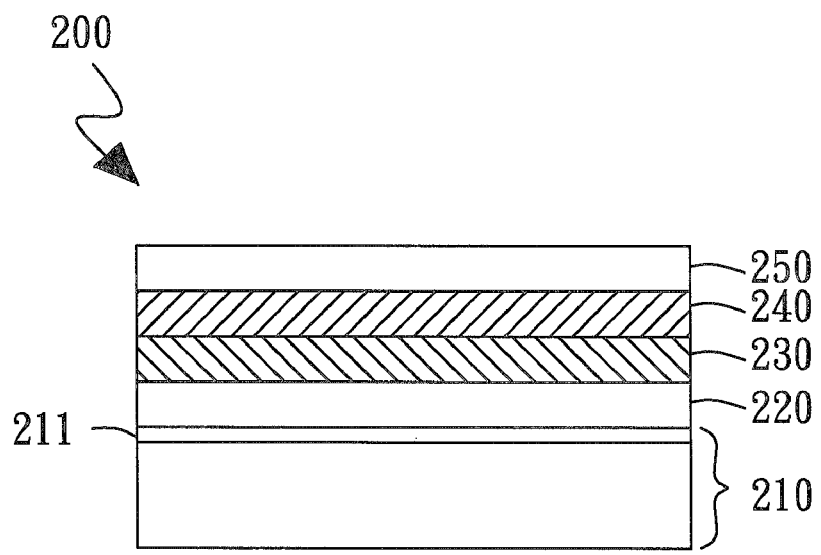
FIG. 1A shows a sectional view of an organic optoelectronic device in accordance with an embodiment of the present invention.

FIG. 1A shows a sectional view of an organic optoelectronic device 200 in accordance with an embodiment of the present invention. The organic optoelectronic device 200 can be a solar cell, a light-emitting diode, or a light sensor. The organic optoelectronic device 200 includes a conductive substrate 210, a first electrode 220, an organic layer 230, a transition metal oxide layer 240, and a second electrode 250. The conductive substrate 210 includes a conductive layer 211. The conductive layer 211 can be used as an electrode. The material of the conductive layer 211 can be indium tin oxide (ITO) or another conductive material. The first electrode 220 and the second electrode 250 are disposed above the conductive substrate 210. The organic layer 230 and the transition metal oxide layer 240 are disposed between the first electrode 220 and the second electrode 250, wherein the transition metal oxide layer 240 contacts (i.e., contacts directly) the organic layer 230. The transition metal oxide layer 240 is composed of a plurality of stacked micro/nano transition metal oxide structures. (In the present description, "micro/nano" refers to "micrometer and/or nanometer.") The transition metal oxide layer 240 is formed by a suspension coating method or a solution coating method. The transition metal oxide layer 240 is un-annealed. In the present description, "suspension" refers to situations where micro/nano transition metal oxide structures are suspended within a solvent; "solution." refers to the situation of a suspension that further includes transition metal oxide ions or a precursor of transition metal oxide.

According to this embodiment, part or all of the micro/nano transition metal oxide structures can be formed in single crystalline, polycrystalline, or amorphous form. That is, in the present and other embodiments, the crystal phase of the micro/nano transition metal oxide structure can be single crystalline, polycrystalline, or amorphous. Part or all of the micro/nano transition metal oxide structures include at least one material or any combination selected from the group consisting of: a micro/nano particle, a micro/nano island, a micro/nano rod, a micro/nano wire, a micro/nano tube, and a micro/nano porous structure.

In one example, the micro/nano transition metal oxide structure is a transition metal oxide crystal structure. The method of making the structure includes providing micro/nano transition metal oxide crystal structures, and performing a mixing process to disperse the micro/nano transition metal oxide uniformly and optionally to dissolve part of said micro/nano transition metal oxide within, a solvent. According to one aspect, the mixing process can be performed to effectuate one or more of uniform dispersing and dissolving of at least part of the micro/nano transition metal oxide within said solvent. In the example, the method includes forming a suspension or solution by mixing the micro/nano transition metal oxide crystal structures with the solvent, and coating the suspension or solution on a substrate for forming the transition metal oxide layer by stacking deposition. Thus, there is no need to use an annealing treatment for forming the oxide crystals. The method differs from the conventional vacuum evaporation process or the sol-gel method apparently (e.g., in a discernable fashion).

Moreover, the transition metal oxide layer 240 is disposed between the second electrode 250 and the organic layer 230. When the second electrode 250 is a cathode, the transition metal oxide layer 240 can be a p-type oxide semiconductor. The p-type oxide semiconductor includes at least one material or any combination selected from the group consisting of vanadium oxide, silver oxide, nickel oxide, molybdenum oxide, and copper oxide. When the second electrode 250 is an anode, the transition metal oxide layer 240 can be an n-type oxide semiconductor. The n-type oxide semiconductor includes at least one material or any combination selected from the group consisting of: tungsten oxide, titanium oxide, and zinc oxide.

Figure 1B:
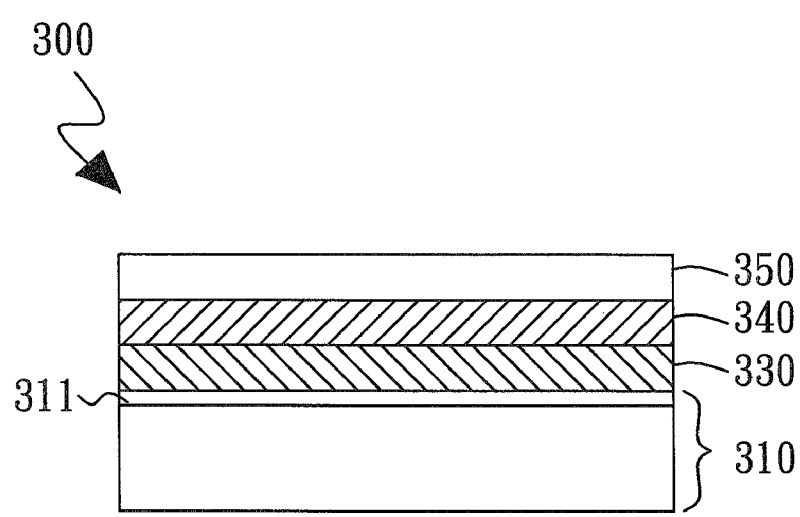
FIG. 1B shows a sectional view of an organic optoelectronic device in accordance with another embodiment of the present invention.

FIG. 1B shows a sectional view of an organic optoelectronic device 300 in accordance with another embodiment of the present invention. The organic optoelectronic device 300 includes a conductive substrate 310, an organic layer 330, a transition metal oxide layer 340, and a second electrode 350. The conductive substrate 310 includes a conductive layer 311. The conductive layer 311 is used as a first electrode 311. The second electrode 350 is disposed over the first electrode 311. The organic layer 330 and the transition metal oxide layer 340 are disposed between the first electrode 311 and the second electrode 350, wherein the transition metal oxide layer 340 contacts (i.e., contacts directly) the organic layer 330, and the organic layer 330 contacts (i.e., contacts directly) the first electrode 311. The transition metal oxide layer 340 is composed of a plurality of stacked micro/nano transition metal oxide structures. The transition metal oxide layer 340 is formed by a suspension coating method or a solution coating method. The transition metal oxide layer 340 is un-annealed.

Figure 1C:
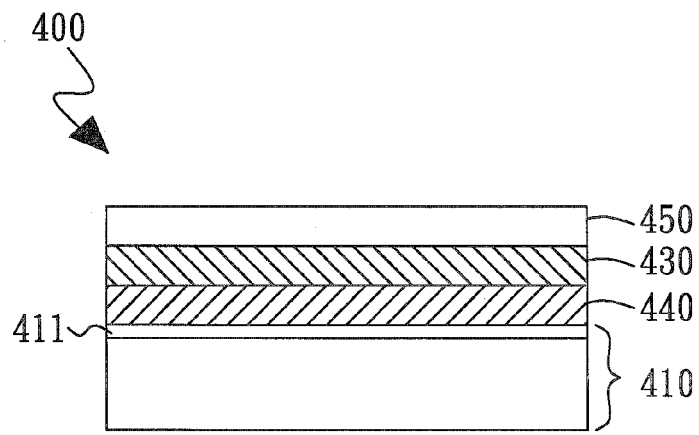
FIG. 1C shows a sectional view of an organic optoelectronic device in accordance with another embodiment of the present invention.

FIG. 1C shows a sectional view of an organic optoelectronic device 400 in accordance with another embodiment of the present invention. The organic optoelectronic device 400 includes a conductive substrate 410, an organic layer 430, a transition metal oxide layer 440, and a second electrode 450. The conductive substrate 410 includes a conductive layer 411. The conductive layer 411 is used as a first electrode 411. The second electrode 450 is disposed over the first electrode 411. The organic layer 430 and the transition metal oxide layer 440 are disposed between the first electrode 411 and the second electrode 450, wherein the transition metal oxide layer 440 contacts (i.e., contacts directly) the organic layer 430, and the transition metal oxide layer 440 contacts (i.e., contacts directly) the first electrode 411. The transition metal oxide layer 440 is composed of a plurality of stacked micro/nano transition metal oxide structures. The transition metal oxide layer 440 is formed by a suspension coating method or a solution coating method. The transition metal oxide layer 440 is un-annealed.

Figure 2:
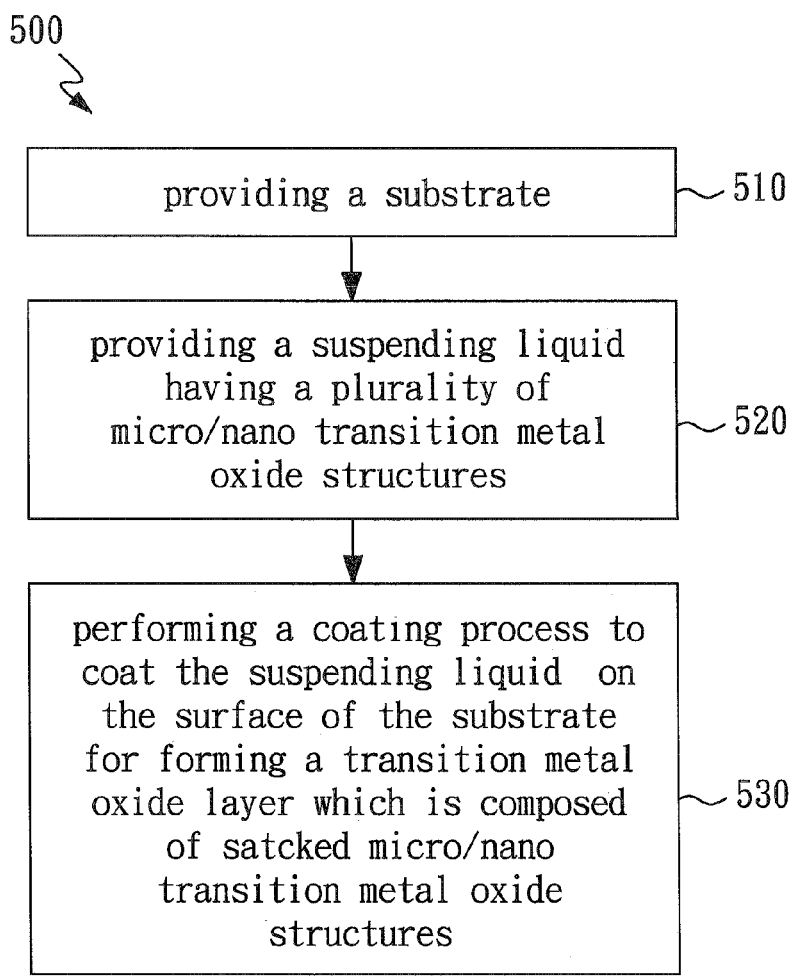
FIG. 2 shows a flow diagram of a method of making an organic optoelectronic device in accordance with another embodiment of the present invention.

FIG. 2 shows a flow diagram of a method 500 of making an organic optoelectronic device in accordance with another embodiment of the present invention. The method 500 includes the following steps; step 510, providing a substrate; step 520, providing a solution or suspension having a plurality of micro/nano transition metal oxide structures; and step 530, performing a coating process for coating the solution or suspension on the surface of the substrate. When the solvent of the solution or suspension is removed, the micro/nano transition metal oxide structures are stacked for forming a transition metal oxide layer on the substrate. The transition metal oxide layer is un-annealed.

The substrate can be a first electrode or a first electrode covered with an organic layer. If the substrate is a first electrode covered with an organic layer, the coating process includes coating the solution or suspension on the surface of the organic layer directly. The solution or suspension includes a solvent; the dielectric constant of the solvent differs from the dielectric constant of the organic layer apparently (e.g., discernibly) so as to avoid situations of the solvent dissolving or damaging the organic layer. The solvent can include at least one material or any combination selected from the group consisting of; water and C1-C4 alcohols. For example, when the material of the organic layer is poly 3-hexylthiophene (P3HT), which has a dielectric constant of about 3, the suitable solvent for P3HT is isopropanol (IPA) with a dielectric constant of about 18. This combination can prevent the solvent from dissolving or damaging the organic layer. In one example, the solution, or suspension is used for the hole injection layer, hole transporting layer, electron injection layer, or electron transporting layer of the organic optoelectronic device.

Figure 3A:
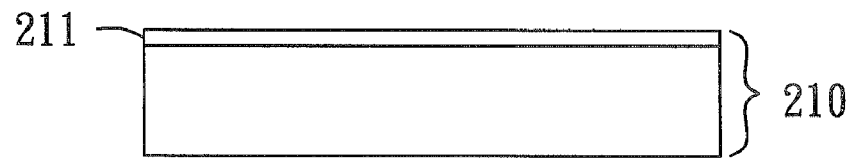
FIGS. 3A-3E show steps of making the organic optoelectronic device.

FIGS. 3A-3E show steps of making the organic optoelectronic device 200 shown in FIG. 1A. Referring to FIG. 3A, a conductive substrate 210 is provided. The conductive substrate 210 has a conductive layer 211. The conductive layer 211 can be used as an electrode. The material of the conductive layer 211 can be ITO or another conductive material.

Figure 3B:
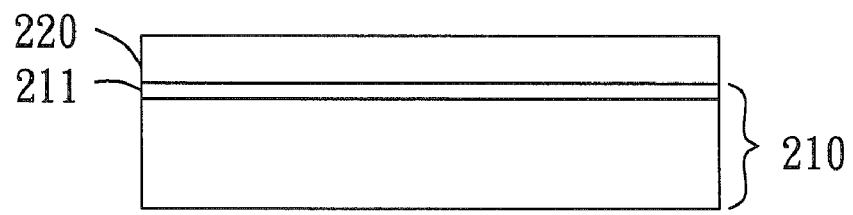
Figure 3C:
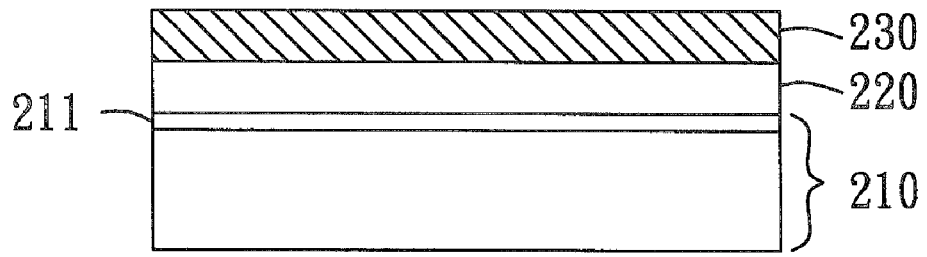

Referring to FIG. 3B, a first electrode 220 is formed on the conductive layer 211. In this embodiment, a sol-gel solution is coated on the conductive layer 211 by spin coating, and an annealing treatment is performed for forming the first electrode 220 having zinc oxide (ZnO), but is not limited to this. The first electrode 220 can be another material or formed by another method. Referring to FIG. 3C, an organic layer 230 is formed on the first electrode 220 by spin coating.

Figure 3D:
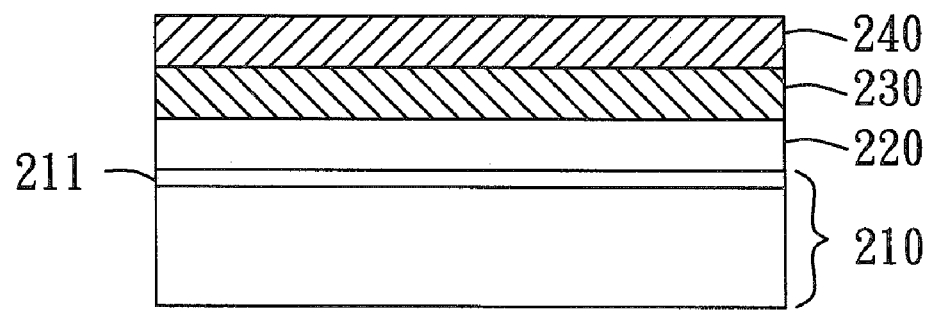

Referring to FIG. 3D, a solution or suspension having a plurality of micro/nano transition metal oxide structures is provided, wherein each milliliter (ml) of the solution or suspension includes 0.01-100 mg of the micro/nano transition metal oxide structures. Then, a coating process is performed for coating the solution or suspension on the surface of the organic layer 230. The micro/nano transition metal oxide structures are stacked for forming the transition metal oxide layer 240. In this embodiment, the solution or suspension is coated on the organic layer 230 by spin coating, but is not limited to this. The solution or suspension can be coated on the organic layer 230 by jet printing, screen printing, contact coating, dip coating, or roll-to-roll printing.

In this embodiment, part or all of the micro/nano transition metal oxide structures include at least one material or any combination selected from the group consisting of: a micro/nano particle, a micro/nano island, a micro/nano rod, a micro/nano wire, a micro/nano tube, and a micro/nano porous structure. The solution, or suspension can be treated by an ultrasonic agitation process for a suitable time so as to make part or all of the micro/nano transition metal oxide structures be suspended and dispersed uniformly within the solvent.

When the solution or suspension includes a specific weight of the micro/nano transition metal oxide structures and a specific volume of the solvent, the solution or suspension has a specific concentration so as to form the transition metal oxide layer 240. For example, when the micro/nano transition metal oxide is copper oxide (CuO), the specific concentration is about 0.01-1 mg/ml, wherein, the specific concentration is about 0.1 mg/ml preferably. When the micro/nano transition metal oxide is vanadium oxide ($V_2O_5$), the specific concentration is about 0.01-1 mg/ml, wherein the specific concentration is about 0.1 mg/ml preferably. When the micro/nano transition metal oxide is tungsten oxide ($WO_3$), the specific concentration is about 0.01-1 mg/ml, wherein the specific concentration is about 0.1 mg/ml preferably. When the micro/nano transition metal oxide is nickel oxide (NiO), the specific concentration is about 0.01-1 mg/ml, wherein the specific concentration is about 0.1 mg/ml preferably.

Moreover, different kinds of micro/nano transition metal oxide structures can be mixed for forming a transition metal oxide layer 240 composed of different kinds of micro/nano transition metal oxides. For example, when vanadium oxide ($V_2O_5$) and tungsten oxide ($WO_3$) are selected, to be mixed, the specific concentrations of vanadium oxide ($V_2O_5$) and tungsten oxide ($WO_3$) are about 0.01-1 mg/ml, wherein the specific concentration of vanadium oxide ($V_2O_5$) is about 0.1 mg/ml preferably, and the specific concentration of vanadium oxide ($V_2O_5$) is about 0.1 mg/ml preferably.

The provided suspension coating method for forming the transition metal oxide layer 240 has many advantages. For example, large-area devices can be made by low-cost equipment. The producing processes of the devices are quick and simple. When the solvent is removed the transition metal oxide layer 240 is subsequently formed on the organic layer 230. Compared to the conventional vacuum evaporation process for forming the transition metal oxide layer, the present invention provides a low-cost and more efficient way.

Moreover, the crystal phase of the transition metal oxide layer formed by the vacuum evaporation process is usually amorphous. It is needed to use the annealing treatment to adjust the crystal phase of the transition metal oxide layer. However, the high temperature of the annealing treatment will seriously damage the organic layer 230.

The micro/nano transition metal oxide structures can be or comprise be formed in) single crystalline, polycrystalline, or amorphous compositions. The crystal phase of the transition metal oxide layer 240 is same as the crystal phase of the micro/nano transition metal oxide structures. Thus, the crystal phase of the transition metal oxide layer 240 formed by the suspension coating method can be a required crystal phase without the annealing treatment.

Moreover, the micro/nano transition metal oxide structures used in the suspension coating method can be a mixture of different kinds of micro/nano transition metal oxide structures for forming a transition metal oxide layer 240. Different kinds of micro/nano transition metal oxide structures will have different properties and different effects on the organic optoelectronic device. Thus, using different kinds of micro/nano transition metal oxide structures may optimize the characteristics of the organic optoelectronic device.

The conventional co-evaporation method of vacuum evaporation can also be used for forming a transition metal oxide layer composed of different kinds of transition metal oxides. However, different kinds of transition metal oxides will have different boiling points. It is difficult for the co-evaporation method to form a transition metal oxide layer having different kinds of transition metal oxides according to the required ratio. Moreover, during the co-evaporation method, new oxide alloys are usually co-produced, which may affect the characteristics of devices.

On the contrary, the above-mentioned suspension coating method provides an easier and better way for forming the transition metal oxide layer 240 composed of different kinds of micro/nano transition metal oxides according to the specific ratio. Any kinds of transition metal oxides having any ratio or concentration can be formed within a single transition metal oxide layer without considering the boiling point issues or the new oxide alloy issues.

Figure 3E:
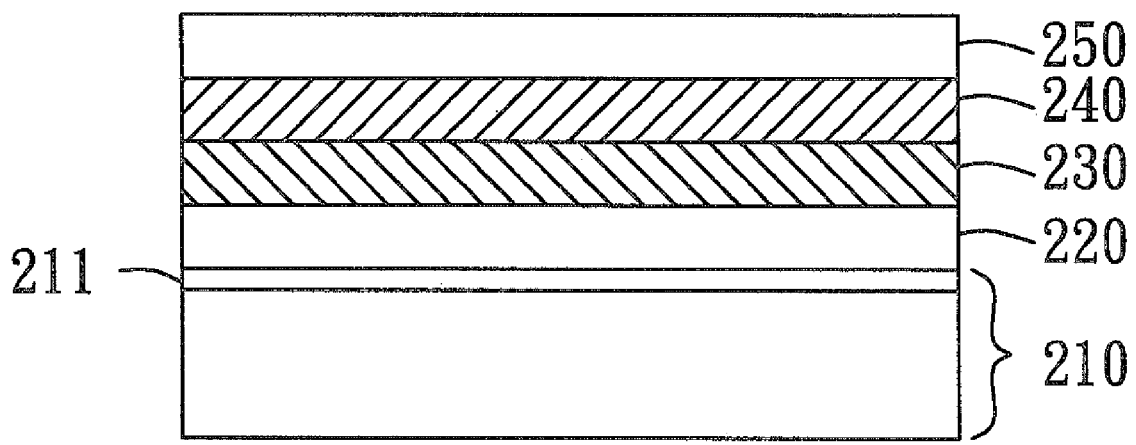

Finally, referring to FIG. 3E, a second electrode 250 is formed on the transition metal oxide layer 240. According to this embodiment, the second electrode 250 is a silver electrode, but is not limited to this. The second electrode 250 can be formed by other materials.

According to this embodiment, the micro/nano transition metal oxide structures can embody (e.g., be formed in) single crystalline, polycrystalline, or amorphous forms. Part or all of the micro/nano transition metal oxide structures include at least one material or any combination selected from the group consisting of: a micro/nano particle, a micro/nano island, a micro/nano rod, a micro/nano wire, a micro/nano tube, and a micro/nano porous structure.

Moreover, the transition metal oxide layer 240 is disposed between the second electrode 250 and the organic layer 230. When the second electrode 250 is a cathode, the transition metal oxide layer 240 can be a p-type oxide semiconductor. The p-type oxide semiconductor includes at least one material or any combination selected from the group consisting of: vanadium oxide, silver oxide, nickel oxide, molybdenum oxide, and copper oxide. When the second electrode 250 is an anode, the transition metal oxide layer 240 can be an n-type oxide semiconductor. The n-type oxide semiconductor includes at least one material or any combination selected from the group consisting of: tungsten oxide, titanium oxide, and zinc oxide.

Figure 4:
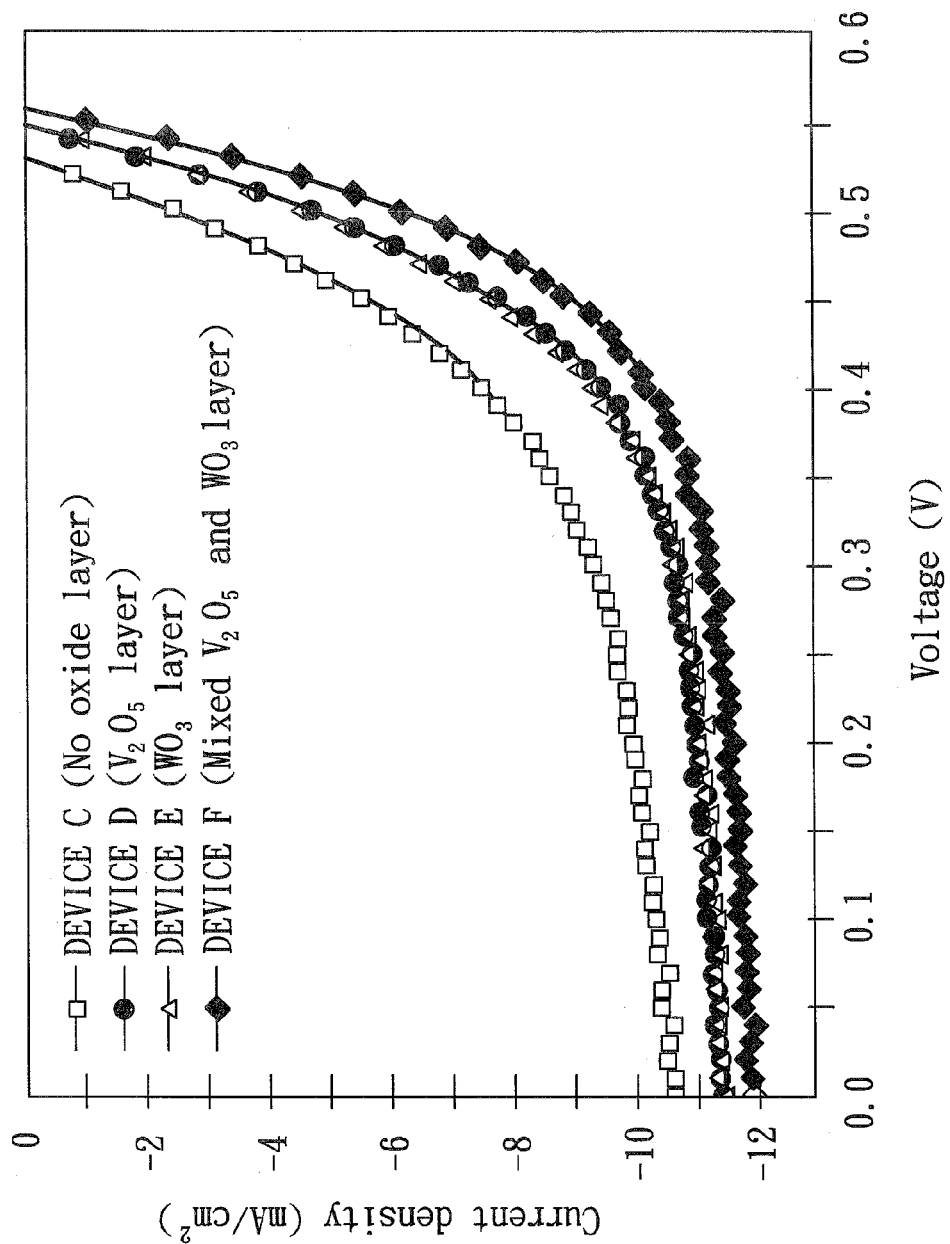
FIG. 4 shows current-voltage characteristics of different organic optoelectronic devices.

FIG. 4 shows current-voltage characteristics of different organic optoelectronic devices. The device C is a solar cell without the transition metal oxide layer of the present invention. The device D is a solar cell having the transition metal oxide layer 240 composed of vanadium oxide ($V_2O_5$). The device E is a solar cell having the transition metal oxide layer 240 composed of tungsten oxide ($WO_3$). The device F is a solar cell having the transition metal oxide layer 240 composed of vanadium oxide ($V_2O_5$) and tungsten oxide ($WO_3$), wherein the weight ratio of vanadium oxide ($V_2O_5$) and tungsten oxide ($WO_3$) is 1:1.

The different devices show different current-voltage characteristics under the same light intensity of 1.00 mA/cm². As shown in FIG. 4, the fill factor of the device F is highest; the fill factor of the device C is lowest; the fill factors of the devices D and E are intermediary or in the middle. Thus, the transition metal oxide layer 240 can improve the current-voltage characteristics of the solar cell, wherein the transition metal oxide layer 240 composed of vanadium oxide ($V_2O_5$) and tungsten oxide ($WO_3$) has the best characteristic. This is because the mixed transition metal oxide layer has a higher ability of decreasing current leakage than the single transition metal oxide layer.

Figure 5:
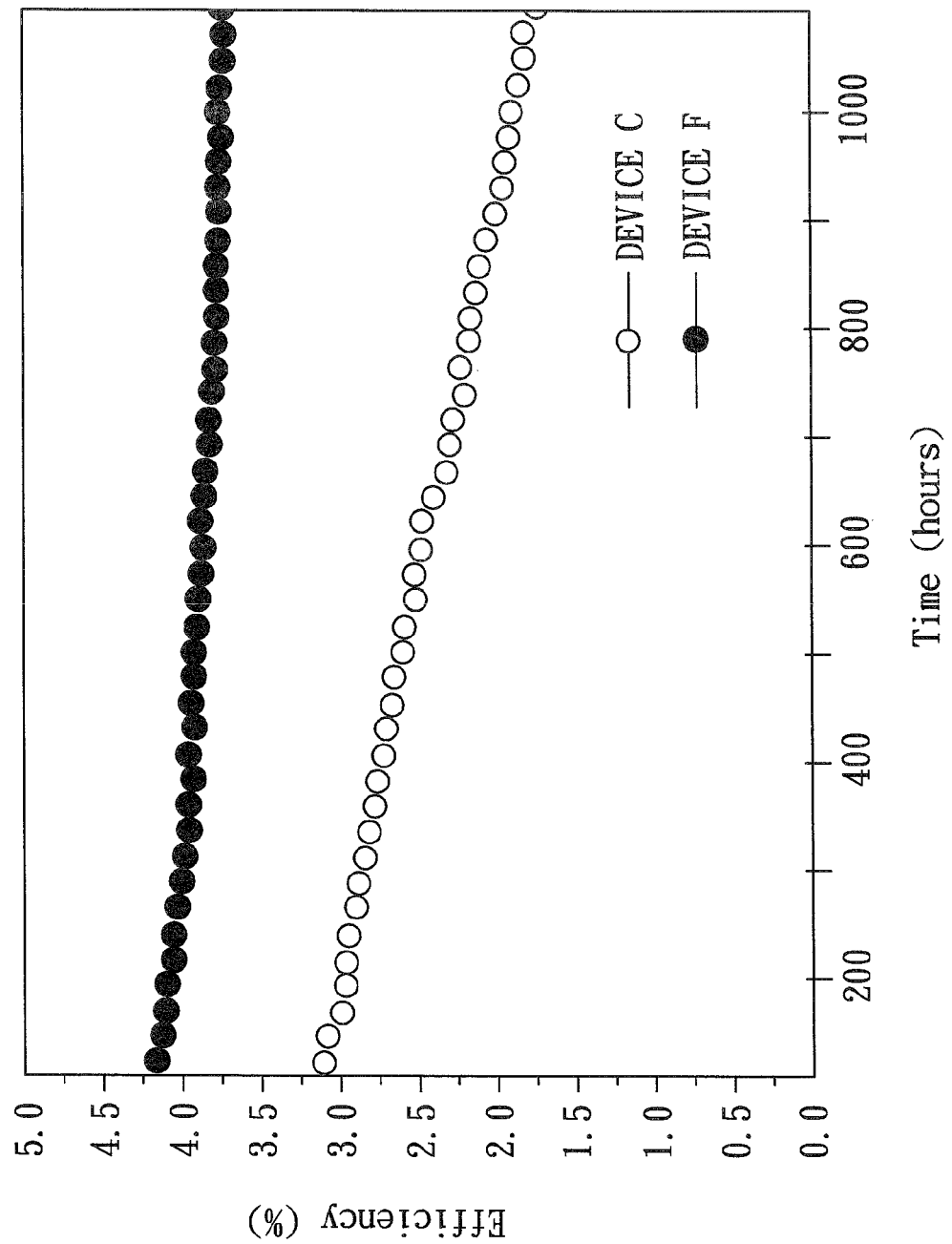
FIG. 5 shows life characteristics of different organic optoelectronic devices.

FIG. 5 shows life characteristics of different organic optoelectronic devices. The device C and the device F shown in FIG. 4 are stored in air for comparing the life characteristics, wherein the device C and the device F are un-encapsulated. As shown in FIG. 5, after being stored in air for 1000 hours, the efficiency of the device F decreases to 90% of the highest efficiency. The decreasing amount is about 1.0%. After being stored in air for 1000 hours, the efficiency of the device C decreases to 60% of the highest efficiency. The decreasing amount is about 40%. Thus, the transition metal oxide layer 240 can prevent moisture from entering the device effectively; therefore, the damage the organic layer 230 caused by the moisture is avoided.

Because the transition metal oxide layer 240 of the present invention can prevent moisture from entering the device effectively, the stability of the device can be improved greatly. Moreover, the device can be encapsulated with low-level technologies for decreasing the encapsulating cost.

Although specific embodiments have been illustrated and described, it will be appreciated by those skilled in the art that various modifications may be made without departing from the scope of the present invention, which is intended to be limited solely by the appended claims.

What is claimed is:

1. A method of making an organic optoelectronic device, comprising:
providing a substrate, wherein said substrate is a first electrode covered with an organic layer;
providing a solution or suspension having a plurality of micro/nano transition metal oxide structures; and
performing a coating process for coating said solution or suspension on the surface of said organic layer, for forming a transition metal oxide layer on said substrate, said transition metal oxide layer being composed of stacked micro/nano transition metal oxide structures, wherein said transition metal oxide layer is un-annealed.

2. The method of making an organic optoelectronic device according to claim 1, wherein said substrate is a first electrode.

3. The method of making an organic optoelectronic device according to claim 1, wherein said solution or suspension comprises a solvent, the dielectric constant of said solvent differs from the dielectric constant of said organic layer, and said solvent does not dissolve or damage said organic layer.

4. The method of making an organic optoelectronic device according to claim 1, wherein said solvent comprises at least one material or any combination selected from the group consisting of: water and C1-C4 alcohols.

5. The method of making an organic optoelectronic device according to claim 1, wherein each ml of said solution, or suspension comprises 0.01-100 mg of said micro/nano transition metal oxide structures.

6. The method of making an organic optoelectronic device according to claim 1, wherein part or all of said micro/nano transition metal oxide structures comprise at least one material or any combination selected from the group consisting of: a micro/nano particle, a micro/nano island, a micro/nano rod, a micro/nano wire, a micro/nano tube, and a micro/nano porous structure.

7. The method of making an organic optoelectronic device according to claim 1, wherein the crystal phase of said micro/nano transition metal oxide structures is single crystalline, polycrystalline, or amorphous.

8. The method of making an organic optoelectronic device according to claim 1, wherein said transition, metal oxide layer is a p-type oxide semiconductor, and said p-type oxide semiconductor comprises at least one material or any combination selected from the group consisting of: vanadium oxide, silver oxide, nickel oxide, molybdenum oxide, and copper oxide.

9. The method of making an organic optoelectronic device according to claim 1, wherein said transition metal oxide layer is an n-type oxide semiconductor, and said n-type oxide semiconductor comprises at least one material or any combination selected from the group consisting of: tungsten oxide, titanium oxide, and zinc oxide.

* * * * *